(12) United States Patent
Young et al.

(10) Patent No.: US 7,382,157 B1
(45) Date of Patent: Jun. 3, 2008

(54) INTERCONNECT DRIVER CIRCUITS FOR DYNAMIC LOGIC

(75) Inventors: Steven P. Young, Boulder, CO (US); Ramakrishna K. Tanikella, Thornton, CO (US); Manoj Chirania, Palo Alto, CA (US); Venu M. Kondapalli, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 73 days.

(21) Appl. No.: 11/541,986

(22) Filed: Oct. 2, 2006

Related U.S. Application Data (63) Continuation-in-part of application No. 10/941,607, filed on Sep. 15, 2004, now Pat. No. 7,116,131.

(51) Int. Cl.
*H03K 19/177* (2006.01)

(52) U.S. Cl. .................... 326/41; 326/47; 326/101; 326/98

(58) Field of Classification Search ............ 326/41, 326/47, 101, 95, 98
See application file for complete search history.

(56) References Cited

U.S. PATENT DOCUMENTS

| | | | |
|---|---|---|---|
| 4,740,721 A | 4/1988 | Chung et al. | |
| 4,812,685 A | 3/1989 | Anceau | |
| 5,440,182 A | 8/1995 | Dobbelaere | |
| 5,596,743 A | 1/1997 | Bhat et al. | |
| 5,914,616 A | 6/1999 | Young et al. | |
| 5,942,917 A * | 8/1999 | Chappell et al. | ............ 326/121 |
| 5,952,846 A | 9/1999 | Silver | |
| 6,150,838 A | 11/2000 | Wittig et al. | |
| 6,229,338 B1 | 5/2001 | Coulman et al. | |
| 6,278,290 B1 * | 8/2001 | Young | .......... 326/41 |
| 6,285,218 B1 | 9/2001 | Dhong et al. | |
| 6,433,581 B1 | 8/2002 | Song | |
| 6,614,258 B2 | 9/2003 | Song | |
| 6,768,342 B2 * | 7/2004 | Greenstreet et al. | .......... 326/93 |
| 6,768,846 B2 | 7/2004 | Young et al. | |
| 6,992,505 B1 | 1/2006 | Zhou | |
| 2002/0141234 A1 * | 10/2002 | Kaviani | ............ 365/181 |

OTHER PUBLICATIONS

Xilinx, Inc.; Rahman et al.; U.S. Appl. No. 11/210,498, filed Aug. 24, 2005.

* cited by examiner

*Primary Examiner*—Vibol Tan
(74) *Attorney, Agent, or Firm*—Lois D. Cartier (57) ABSTRACT

Interconnect driver circuits that can be used in the interconnect structures of dynamic integrated circuits (ICs) such as dynamic programmable logic devices (PLDs). An exemplary IC includes two or more logic circuits, and two or more self-resetting interconnect driver circuits coupled between the logic circuits. Each self-resetting interconnect driver circuit includes a multiplexer circuit driving a buffer circuit. In a first state, the buffer circuit drives a first value onto the output terminal of the buffer circuit. In a second state, the buffer circuit first drives a second value onto the output terminal of the buffer circuit and then returns to the first state. Several different circuits are described in detail.

17 Claims, 5 Drawing Sheets

INTERCONNECT DRIVER CIRCUITS FOR DYNAMIC LOGIC

CROSS-REFERENCE TO RELATED APPLICATIONS

This application is a continuation-in-part of commonly assigned application Ser. No. 10/941,607, by Manoj Chirania et al., entitled "High Performance Programmable Logic Devices Utilizing Dynamic Circuitry" and filed Sep. 15, 2004 now U.S. Pat. No. 7,116,131, which is incorporated herein by reference.

FIELD OF THE INVENTION

The invention relates to integrated circuit devices (ICs) including dynamic logic. More particularly, the invention relates to interconnect driver circuits for ICs that include dynamic logic.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

A PLD interconnect structure can be complex and highly flexible. For example, Young et al. describe the interconnect structure of an exemplary FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

Figure 1:
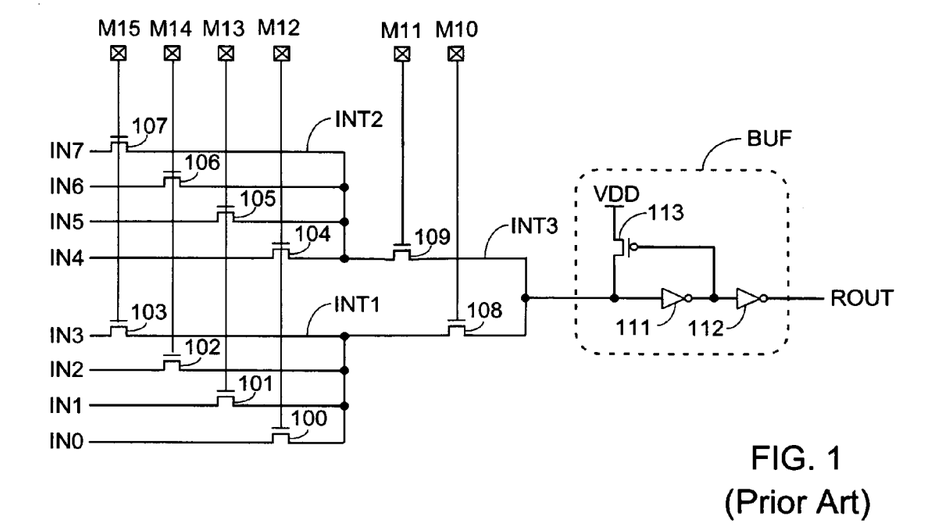
FIG. 1 illustrates a well known programmable routing multiplexer that can be used, for example, in the interconnect structure of a PLD.

Programmable interconnect points (PIPs) are often coupled into groups that implement multiplexer circuits selecting one of several interconnect lines to provide a signal to a destination interconnect line or logic block. A routing multiplexer can be implemented, for example, as shown in FIG. 1. The illustrated circuit selects one of several different input signals and passes the selected signal to an output terminal. Note that FIG. 1 illustrates a routing multiplexer with eight inputs, but PLD routing multiplexers typically have many more inputs, e.g., 28, 30, or 32. However, FIG. 1 illustrates a smaller circuit, for clarity.

The routing multiplexer of FIG. 1 includes eight input terminals IN0-IN7 and ten pass gates 100-109. Pass gates 100-103 selectively pass input signals IN0-IN3, respectively, to a first internal node INT1. (Note that In the present specification, the same reference characters are used to refer to terminals, nodes, signal lines, and their corresponding signals.) Each pass gate 100-103 has a gate terminal driven by a configuration memory cell M12-M15, respectively. Similarly, pass gates 104-107 selectively pass input signals IN4-1N7, respectively, to a second internal node INT2. Each pass gate 104-107 has a gate terminal driven by one of the same configuration memory cells M12-M15, respectively. From internal nodes INT1, INT2, pass gates 108, 109 are controlled by configuration memory cells M10, M11, respectively, to selectively pass at most one signal to a third internal node INT3.

The signal on internal node INT3 is buffered by buffer BUF to provide output signal ROUT. Buffer BUF includes two inverters 111, 112 coupled in series, and a pullup (e.g., a P-channel transistor 113 to power high VDD) on internal node INT3 and driven by the node between the two inverters.

Values stored in configuration memory cells M10-M15 select at most one of the input signals IN0-IN7 to be passed to internal node INT3, and hence to output node ROUT. If none of the input signals is selected, output signal ROUT is held at its initial high value by pullup 113. Pullup 113 also pulls signal INT3 fully to power high VDD to fully shut off the pullup of inverter 111.

Figure 2:
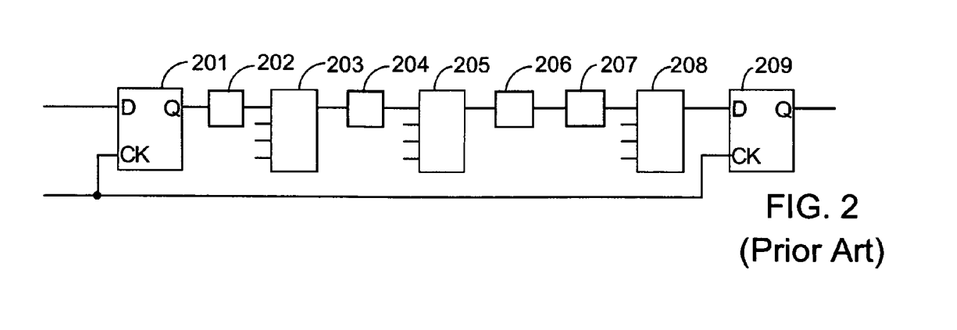
FIG. 2 illustrates an exemplary signal path in a known PLD.

Clearly, a circuit implemented in flexible programmable logic can potentially be slower than circuitry implemented using dedicated logic (i.e., logic designed for a specific purpose). For example, a circuit implemented using programmable lookup tables (LUTs) and flip-flops might need to traverse a succession of LUTs and interconnections between each pair of successive flip-flops, as shown in FIG. 2. The exemplary signal path illustrated in FIG. 2 connects an output terminal of flip-flop 201 with an input terminal of flip-flop 209, and sequentially traverses interconnect 202, LUT 203, interconnect 204, LUT 205, interconnect 206, interconnect 207, and LUT 208. The path delay includes one clock-to-out delay for flip-flop 201, four interconnect delays, three LUT delays, and one setup time for flip-flop 209. The total of these delays determines the minimum clock period for the illustrated signal path.

In non-programmable circuits, one known method of increasing circuit performance is the use of dynamic logic. In dynamic circuitry, many or all nodes (e.g., all output nodes) are pre-charged to a first known value. This state is referred to herein as the "pre-charge state". At a later time the circuit enters the "evaluation state", in which the pre-charge is released and some of the pre-charged nodes change to a second known value, as determined by the logic. In clocked dynamic logic, for example, all nodes can be pulled high at a falling edge of a clock, and then some of the nodes are selectively pulled low at the rising edge of the clock. Therefore, whenever the clock is low the circuit is in the pre-charge state, and whenever the clock is high the circuit is in the evaluation state. (Clearly, dynamic circuits also can be designed to operate in the opposite fashion, i.e., to be in the pre-charge state whenever the clock is high, and in the evaluation state whenever the clock is low.) Thus, only the falling edge on the pre-charged nodes is speed-critical, and circuitry can be skewed for a fast falling edge and a slow rising edge on these nodes.

One of the drawbacks of clocked dynamic logic is that distributing the heavily loaded clock signal throughout the dynamic logic consumes a lot of power. Another type of known dynamic logic avoids using a clock signal by utilizing a self-resetting technique, in which the output node is pre-charged during the pre-charge state, then is conditionally discharged (evaluated) whenever an input node of the circuit changes state. Thus, a low pulse might or might not appear at the output node, based on the values of the various input signals.

As is clear from the example illustrated in FIG. 2, interconnect delays can constitute a significant portion of the delay on a critical path in a PLD design. Therefore, it is desirable to provides circuits that facilitate the reduction of interconnect delays in a PLD. It is further desirable to provide circuits that facilitate the reduction of interconnect delays in other types of integrated circuits (ICs), including non-programmable ICs.

SUMMARY OF THE INVENTION

The invention provides interconnect driver circuits that can be used in the interconnect structures of dynamic integrated circuits (ICs) such as dynamic programmable logic devices (PLDs), and ICs including such interconnect driver circuits. According to one embodiment, an IC includes two or more logic circuits, and two or more self-resetting interconnect driver circuits coupled between the logic circuits. Each self-resetting interconnect driver circuit includes a multiplexer circuit driving a buffer circuit. In a first state, the buffer circuit drives a first value onto the output terminal of the buffer circuit. In a second state, the buffer circuit first drives a second value onto the output terminal of the buffer circuit and then returns to the first state.

According to another aspect of the invention, an interconnect driver circuit includes a multiplexer circuit driving a buffer circuit. The buffer circuit is implemented using first and second pullups, an inverter, a pulldown, and a reset circuit. The first pullup is coupled to the input terminal of the buffer circuit and has a gate terminal coupled to the first internal node. The inverter has an input terminal coupled to the input terminal of the buffer circuit and an output terminal coupled to the first internal node. The second pullup is coupled between the inverter and a power high, and has a gate terminal coupled to the second internal node. The first pulldown is coupled between the first internal node and ground, and has a gate terminal coupled to the second internal node. The second pulldown is coupled between the output terminal of the buffer circuit and ground, and has a gate terminal coupled to the first internal node. The reset circuit (an inverter in some embodiments) has an input terminal coupled to the output terminal of the buffer circuit and an output terminal coupled to the second internal node.

In some embodiments, the interconnect driver circuit also includes a third pullup coupled to the output terminal of the buffer circuit and gated by the first internal node. The third pullup can be a P-channel transistor, and N-channel transistor, or can be omitted, if desired.

According to another aspect of the invention, an interconnect driver circuit includes a multiplexer circuit driving a buffer circuit. This embodiment is not self-resetting. The buffer circuit is implemented using first and second pullups, an inverter, and a pulldown. The first pullup is coupled to the input terminal of the buffer circuit and has a gate terminal coupled to an internal node. The inverter has an input terminal coupled to the input terminal of the buffer circuit and an output terminal coupled to the internal node. The second pullup is coupled between the output terminal of the buffer circuit and a power high, and has a gate terminal coupled to the input terminal of the buffer circuit. The pulldown is coupled between the output terminal of the buffer circuit and a ground, and has a gate terminal coupled to the internal node. In some embodiments, the second pullup is an N-channel transistor.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs).

However, the present invention is not limited by these examples, and can be applied to many different types of ICs that include dynamic interconnect resources.

In dynamic logic, both true and complement signals are provided between dynamic logic circuits. Note that in the context of dynamic logic, true and complement signals do not always have opposite values. Instead, both signals are pre-charged to a first known value, which can be either a high value or a low value. In response to some triggering signal, one of the true and complement pre-charged signals then changes to a second and opposite known value. In response to another pre-charge signal (which may be self-generated), both true and complement signals are then pre-charged once again to the first known value. Note that in the exemplary embodiments illustrated herein, the pre-charge values are high values. However, as will be clear to those of skill in the art of designing dynamic circuits, dynamic circuit output signals can be pre-charged to low values, if desired.

Dynamic programmable interconnect can generally be made faster than static interconnect, because only one edge is speed-critical. For example, when the pre-charge value is high, the speed at which each true and complement signal goes high is usually not very important. Instead, the speed at which one of the two signals is pulled low determines the overall speed of the signal path. Therefore, the logic can be skewed to make this critical edge significantly faster than the non-critical (pre-charging) edge. Further, the transistors controlling the speed of the non-critical edge can be made smaller, and thus slower, without affecting the overall performance of the circuit. This area savings can compensate at least partially for the additional area consumed by supplying both true and complement signals. The reduced size of these transistors also reduces loading on the node driving the transistors, and the smaller transistors offer less opposition to a change of state on the output node during the critical edge transition. These factors can improve the overall speed of the critical edge transition.

In some embodiments, a programmable logic device (PLD) includes both dynamic logic such as lookup tables (LUTs) and dynamic interconnect. As described above, dynamic logic can be either clocked or self-resetting. In some embodiments of the present invention, an interconnect driver circuit is self-resetting. In some embodiments, a self-resetting interconnect driver circuit is included in a PLD that includes both self-resetting LUTs and self-resetting interconnect driver circuits. An exemplary self-resetting LUT is described by Chirania et al. in pending U.S. patent application Ser. No. 10/941,607, which is referenced above.

Figure 3:
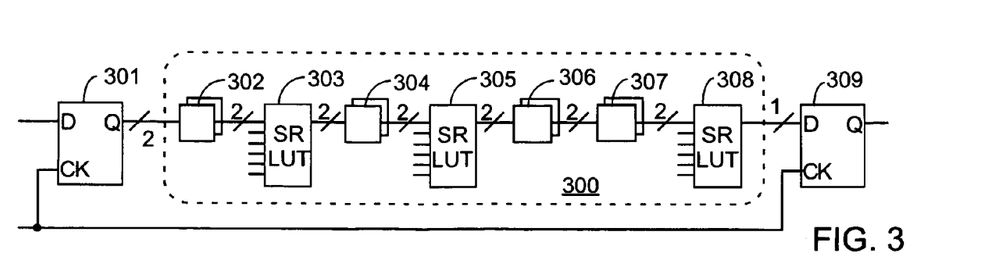
FIG. 3 illustrates an exemplary signal path in a dynamic PLD that utilizes self-resetting logic.

FIG. 3 illustrates an exemplary signal path 300 in a dynamic PLD implemented using self-resetting LUTs and interconnect circuits that may or may not be self-resetting as well. When dynamic logic is used, two interconnect elements are used to interconnect each self-resetting LUT circuit (SR LUT), as shown in FIG. 3, because both true and complement signals are provided between dynamic logic circuits. In the illustrated signal path 300, the true and complement signals from flip-flop 301 sequentially traverse interconnect 302 (two elements), LUT circuit 303 (a single LUT circuit receiving both true and complement input signals and providing both true and complement output signals), interconnect 304 (two elements), LUT circuit 305 (a single LUT circuit), interconnect 306 (two elements), interconnect 307 (two elements), and LUT circuit 308 (a single LUT circuit).

Only one of the true and complement signals need be provided from LUT circuit 308 to flip-flop 309. Nevertheless, signal path 300 uses twice as many interconnect elements as the prior art signal path shown in FIG. 2. However, an advantage of dynamic logic that in some cases can outweigh the increased use of interconnect resources is the increased speed of the signal paths, which can lead to better overall performance of critical paths within a user design, and therefore better overall performance of the design as a whole. Additionally, the impact on power consumption and the overall area required to implement the interconnect resources can be minimized by the use of certain design techniques, as is now described in connection with FIG. 4, for example.

Figure 4:
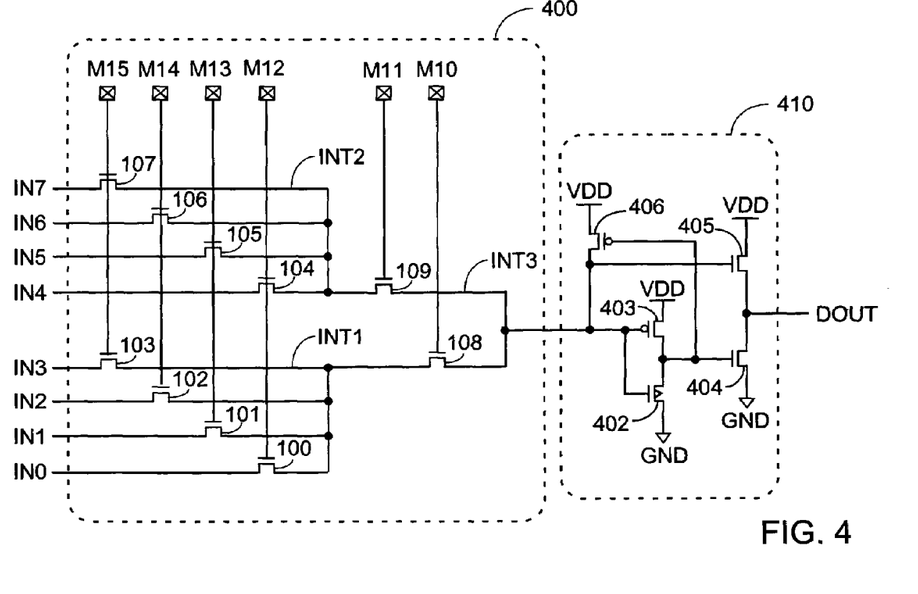
FIG. 4 illustrates a programmable interconnect driver circuit according to an embodiment of the present invention.

FIG. 4 illustrates a first interconnect driver circuit that can be used, for example, in a dynamic PLD such as the dynamic PLD of FIG. 3. For example, the interconnect driver circuit of FIG. 4 can be used to implement each illustrated element of interconnects 302, 304, 306, and 307 in FIG. 3. Thus, the driver circuit of FIG. 4 can be used in pairs, with one of the pair being used for the true signal and the other being used for the complement signal for each dynamic signal pair. (As described above, in dynamic logic the two signals in a pair of dynamic signals do not always have opposite values. However, the terms "true" and "complement" are used to describe these signals herein, for clarity.)

The interconnect driver circuit of FIG. 4 includes an interconnect multiplexer 400 and a buffer circuit 410. Interconnect multiplexer 400 can be implemented, for example, in the same fashion as the multiplexer shown in FIG. 1. Buffer circuit 410 includes N-channel transistors 402, 404, and 405, and P-channel transistors 403 and 406, coupled together as shown in FIG. 4, and has an output node DOUT that can be, for example, an interconnect line in a dynamic PLD. In some embodiments, N-channel transistor 402 is a low-threshold device, as indicated by the triangular shape included in the gate area of the transistor. In other embodiments, transistor 402 is a standard N-channel transistor.

The circuit of FIG. 4 functions as follows. Initially, all input signals IN0-IN7 are high, because they are driven by circuits that are also pre-charged. One of, the input signals IN0-IN7 is selected by high values from two of configuration memory cells M10-M15. Node INT3 is high, pulling up output node DOUT through transistor 405. Therefore, output node DOUT is high. When the selected one of input signals IN0-IN7 goes low, node INT3 goes low, transistor 405 turns off, and transistor 404 turns on. Output signal DOUT goes low.

When the selected input signal goes high again, node INT3 also goes high. Transistor 406 turns on, pulling node INT3 to a fully high value, and fully turning on transistor 405. Output signal DOUT goes high again.

Note that the rise time of a signal driven by buffer circuit 410 is much longer than the fall time, because the pullup 405 on the output node is an N-channel transistor. In traditional interconnect structures, this distinction would not be acceptable, because either the rise time or the fall time of a signal could determine the critical path. However, in a dynamic circuit in which all output signals are set high during a pre-charge state, and then selectively fall during an evaluation state, the rise times of the signals are not as important as the fall times. Therefore, the speed of the rising edges can be sacrificed to reduce power consumption and/or to save area, and, perhaps most importantly, to increase the speed of the falling edge transitions.

The power consumption of the circuit of FIG. 4 is reduced compared to the power consumption of a similar circuit having a traditional P-channel transistor pull-up. The interconnect signal driven by buffer circuit 410 is driven high during each pre-charge period, but the power-high voltage of the signal is reduced from power high VDD by one N-channel threshold voltage VT. Thus, the high voltage on the dynamic output signal DOUT is VDD-VT (power high VDD minus the threshold voltage VT of an N-channel transistor). Leakage through the much larger pulldown 404 prevents the voltage at the output node DOUT from trickling high due to leakage from the pullup. Less power is used than if output signal DOUT were pulled all the way to VDD. Additionally, the speed of the falling edge on signal DOUT is increased because it starts from a reduced high voltage of VDD-VT.

Further, N-channel pullups may enable a more efficient layout than P-channel pullups, due to opportunities of sharing diffusion with the associated N-channel pulldown. Thus, the circuit of FIG. 4 may be smaller than a comparable prior art interconnect driver circuit having the same number of input signals. Clearly, pulldown 404 must be large enough to drive the output load (signal DOUT) effectively. The inverter formed by transistors 402 and 403 should be sized to drive pulldown 404. Pullup 405 can be small, thereby reducing the power consumption of the circuit. Pullup 406 is preferably a weak pullup, and therefore is also small.

In the pictured embodiment, the gate of pullup 405 is driven directly from the output of the multiplexer 400. This arrangement is made practical by the small size of pullup 405, which adds only a modest load to the weakly driven output node of multiplexer 400. Weak pullup 406 causes the multiplexer output node to rise all the way to VDD, fully turning on pullup 405.

Note that the trip point of the inverter formed by transistors 402 and 403, as well as the sizes of transistors 402 and 403, needs to be sufficiently low to robustly function with the limited input voltage of the inverter. The circuit of FIG. 4 also has little tolerance for interconnect noise, due to the limited voltage swings. Therefore, it is important to carefully lay out the circuit to minimize coupling. However, robustness and noise tolerance can be improved, if desired, by using low threshold devices, e.g., for pulldown 402, and also for pullup 405 and the pass gates in multiplexer 400, if desired. When low threshold devices are used, the threshold voltage VT is reduced, and the voltage level VDD-VT is increased. This causes the high output voltage on node DOUT to be a little higher than when standard N-channel transistors are used, which gives additional margin for turning on pulldown 402.

In conventional interconnect circuitry, the use of low threshold voltage transistors is minimized to keep leakage under control. However, in the circuit of FIG. 4, the interconnect (e.g., signal DOUT) will go low only briefly. While the interconnect line DOUT is high, the low threshold voltage transistors do not have sub-threshold leakage. The pass gates in multiplexer 400 do not leak, because all input signals are at the same voltage level; they are all driven by dynamic logic. Pulldown 402 and pullup 405 do not leak, because they are both on. Therefore, low threshold devices may be more practical in the embodiment of FIG. 4 than in previously-known interconnect driver circuits.

Note that the interconnect driver circuit of FIG. 4 is not a self-resetting circuit. Instead, the LUTs interconnected by the driver circuits are self-resetting, or clocked. The reset state "flows through" the driver circuit of FIG. 4. For example, referring to FIG. 3, signal path 300 includes two interconnects 306 and 307 coupled in series. When the interconnects are not driven by self-resetting driver circuits, the reset process occurs as follows. A low-to-high transition from self-resetting LUT 305 is detected by interconnect 306, which then resets as described above. The low-to-high transition from interconnect 306 is then detected by interconnect 307, which then resets in turn. Given the fact that signal paths between self-resetting logic elements (e.g., the SR LUTs in FIG. 3) can include many more than two interconnects coupled in series, it is clear that the resetting process can be quite lengthy when non-self-resetting interconnects are used. Each signal path between two self-resetting elements must drive all interconnects high within one clock cycle. Therefore, the length of the resetting process can potentially be a limiting factor in the speed of operation for a design.

Figure 5:
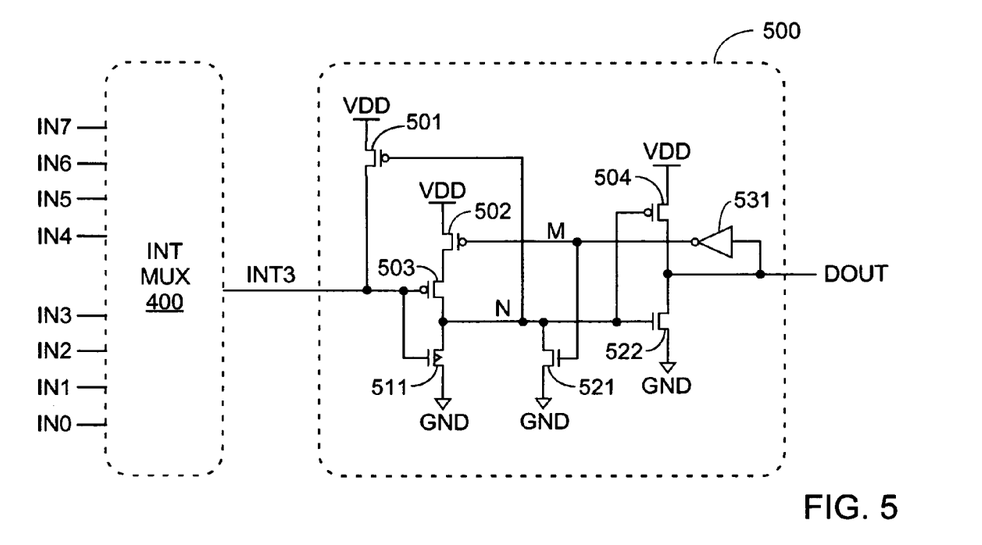
FIG. 5 illustrates a first self-resetting interconnect driver circuit according to an embodiment of the present invention.
Figure 6:
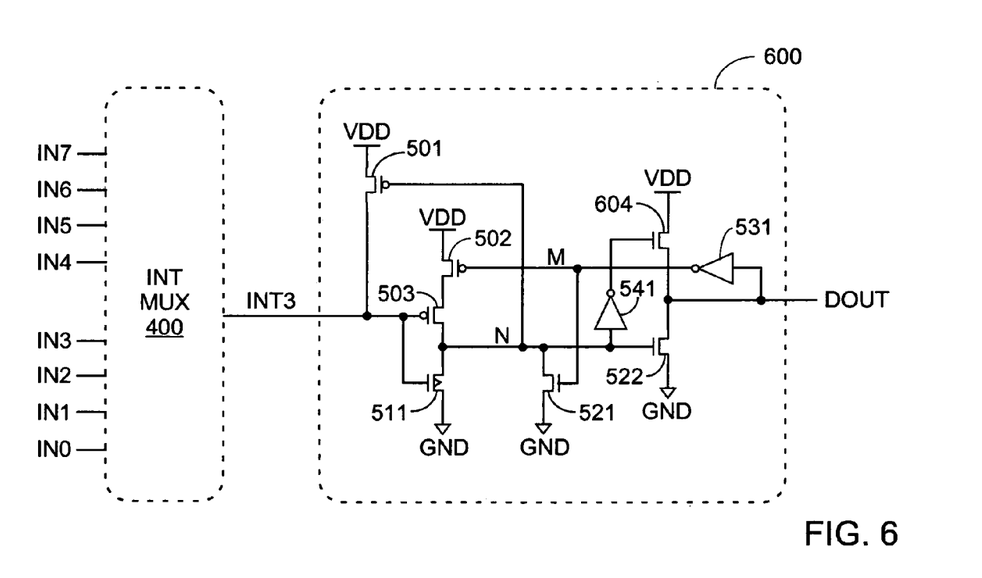
FIG. 6 illustrates a second self-resetting interconnect driver circuit according to an embodiment of the present invention.
Figure 7:
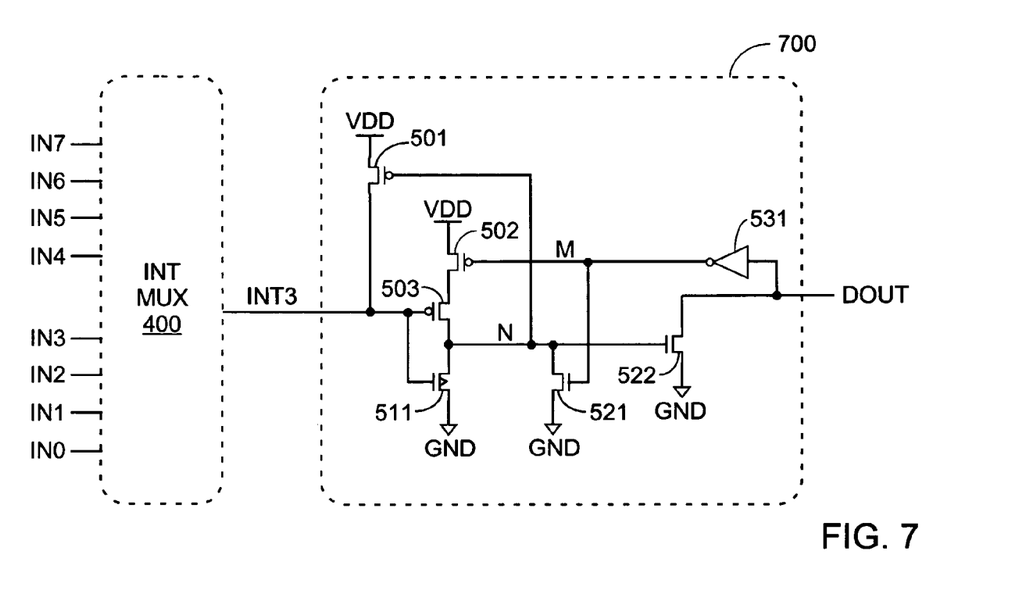
FIG. 7 illustrates an interconnect driver circuit reset by a subsequent driver circuit, according to an embodiment of the present invention.

Therefore, in some embodiments self-resetting interconnect driver circuits are provided, e.g., as shown in FIGS. 5-7.

FIG. 5 illustrates a first self-resetting interconnect driver circuit that can be used, for example, in a dynamic PLD such as the dynamic PLD of FIG. 3. For example, the interconnect driver circuit of FIG. 5 can be used to implement each illustrated element of interconnects 302, 304, 306, and 307 in FIG. 3. Thus, the driver circuit of FIG. 5 can be used in pairs, with one of the pair being used for the true signal and the other being used for the complement signal for each dynamic signal pair.

The interconnect driver circuit of FIG. 5 includes an interconnect multiplexer 400 and a buffer circuit 500. Interconnect multiplexer 400 can be implemented, for example, in the same fashion as the multiplexer of FIG. 4. Buffer circuit 500 includes N-channel transistors 511, 521, and 522, P-channel transistors 501-504, and reset circuit 531, coupled together as shown in FIG. 5, and has an output node DOUT that can be, for example, an interconnect line in a dynamic PLD. In some embodiments, N-channel transistor 511 is a low-threshold device. In other embodiments, transistor 511 is a standard N-channel transistor.

The circuit of FIG. 5 functions as follows. Initially, all input signals IN0-IN7 are high, because they are driven by circuits that are also pre-charged. One of the input signals IN0-IN7 is selected (e.g., by configuration memory cells M10-M15, see FIG. 4) and a high value is placed on node INT3. Node INT3 is high, turning on pull-down 511. Therefore, node N is low. Transistor 501 is on, but since transistor 501 is a weak pullup, the high value passed by interconnect multiplexer 400 is sufficient to overcome transistor 501. Transistor 504 is on, transistor 522 is off, and output node DOUT is high. The high value on node DOUT is inverted by reset circuit 531 and turns on transistor 502. However, transistor 503 is off because of the high value on node INT3, so all nodes in the circuit are stable. Pulldown transistor 521 is off.

When the selected one of input signals IN0-IN7 goes low, node INT3 goes low. Pulldown 511 turns off and transistor 503 turns on. Transistor 502 is already on. Therefore, node N goes high. Transistor 501 turns off. Transistor 504 also turns off, and transistor 522 turns on, so output node DOUT goes low.

When output node DOUT goes low, reset circuit 531 (implemented as an inverter in the pictured example) drives a high value onto node M, turning on transistor 521. Node N goes low, turning on transistors 501 and 504 and turning off transistor 522. Output node DOUT goes high again. The circuit has "self reset".

Note that the transistors of reset circuit 531 are preferably sized to give reset circuit 531 a low trip point, to ensure a complete low pulse that will successfully reset the driver circuit.

As in the example of FIG. 4, the rise time of node DOUT is much longer than the fall time. In a dynamic circuit, this skewing is acceptable, and may even be desirable. The other comments regarding trip points, low-threshold devices, and device sizes made in regard to FIG. 4, above, are also applicable to the circuits of FIGS. 5-7.

FIG. 6 illustrates another exemplary interconnect driver circuit in which P-channel transistor 504 of FIG. 5 is replaced by N-channel transistor 604, which is driven by node N through inverter 541. The use of an N-channel pullup in buffer circuit 600 rather than a traditional P-channel pullup may decrease the overall high-to-low transition time of the interconnect, because the output node DOUT (which can be, for example, an interconnect line in a PLD) does not have as far to fall. In other words, node DOUT falls from a high voltage of VDD-VT, instead of starting from the power high voltage VDD.

FIG. 7 illustrates another embodiment similar to that of FIG. 5, but in which the pullup on node DOUT is entirely eliminated from buffer circuit 700. This pullup is not necessarily needed to reset the interconnect driver circuit, as is now described in connection with FIG. 8.

Figure 8:
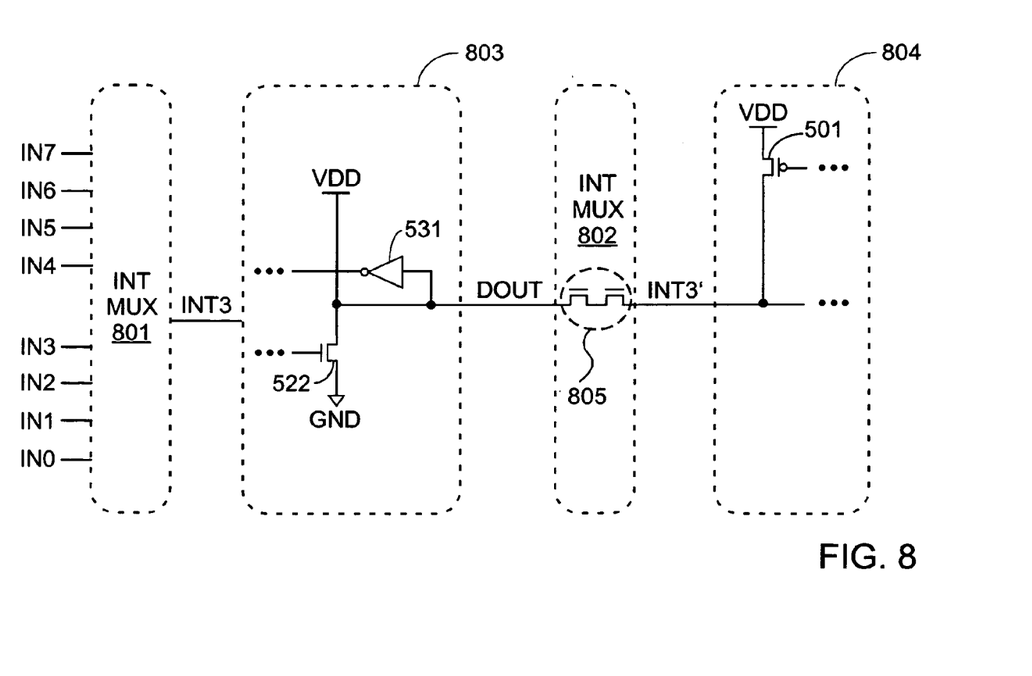
FIG. 8 illustrates how the interconnect driver circuit of FIG. 7 is reset by a subsequent driver circuit.

FIG. 8 shows two interconnect driver circuits coupled in series, with a first interconnect multiplexer 801 being followed by a buffer circuit 803, then another interconnect multiplexer 802 and another buffer circuit 804. Interconnect multiplexers 801-802 can be implemented, for example, in the same fashion as interconnect multiplexer 400 of FIG. 4. Buffer circuits 803-804 are implemented in the same fashion as buffer circuit 700, with only the portions needed for the following explanation being illustrated.

In the pre-charge state, nodes INT3, DOUT, and INT3' are all high. Weak pullup 501 is on.

When a low signal is received by interconnect multiplexer 801 and passed to buffer circuit 803, output node DOUT of buffer circuit 803 goes low, as described above. The low signal is passed through interconnect multiplexer 802 to the input node INT3' of buffer circuit 804. As previously noted, weak pullup 501 in buffer circuit 804 is on. Therefore, when reset circuit 531 in buffer circuit 803 causes transistor 522 to turn off, node DOUT is no longer driven by buffer circuit 803. Now the weak pullup 501 in buffer circuit 804 is the only transistor driving a value onto node DOUT. The high value flows back through the N-channel pass gates 805 in interconnect multiplexer 802 and drives node DOUT to a high value. Therefore, the interconnect driver circuit reenters the pre-charge state.

Clearly, in this embodiment the reset process can be slow, due to the weakness of pullup 501, the resistance of pass gates 805, and the capacitance of interconnect line DOUT. Therefore, this embodiment may not be suitable for all applications. However, for applications in which rise time (and therefore the overall cycle time) is not limiting, this embodiment has the advantage of consuming relatively little area and having a relatively low power dissipation compared with other dynamic circuits.

Figure 9:
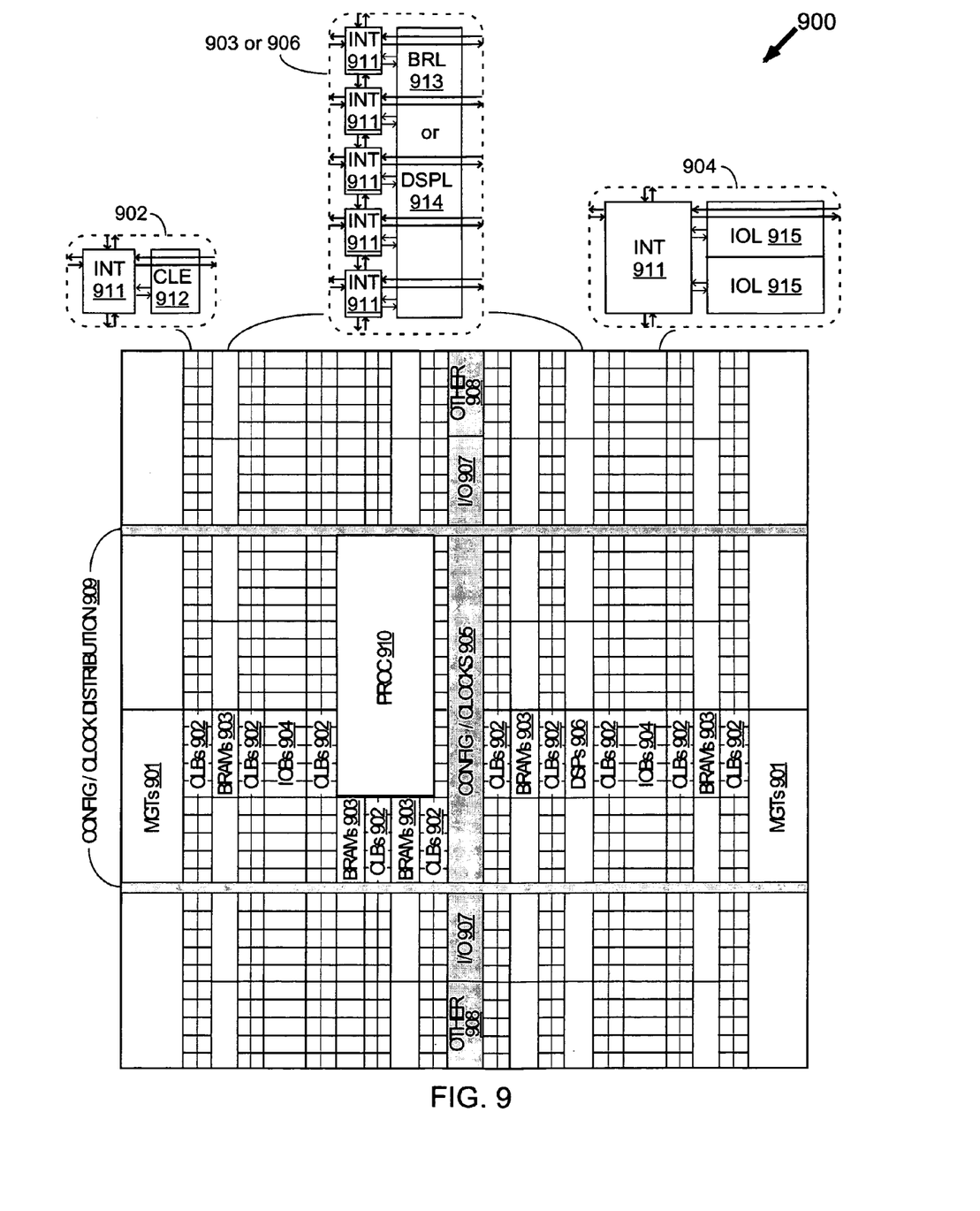
FIG. 9 illustrates an exemplary PLD that can be implemented using the interconnect driver circuits of FIGS. 4-7.

FIG. 9 illustrates an exemplary FPGA that can include interconnect driver circuits implemented, for example, as shown in FIGS. 4-7. The FPGA of FIG. 9 is implemented using dynamic logic. Note that some embodiments include one or more columns of static logic, in addition to the dynamic logic described herein.

FIG. 9 illustrates an FPGA architecture 900 that includes a large number of programmable tiles including programmable logic blocks of various types. These logic blocks can include, for example, multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907) (e.g., configuration ports and clock ports), and other programmable logic 908 such as digital clock managers, analog-to-digital converters, system monitoring logic, and so forth. Some FPGAs also include dedicated processor blocks (PROC 910). Note that in some embodiments at least some of these logic blocks are implemented using static logic instead of or in addition to dynamic logic.

The FPGA of FIG. 9 includes many columns of dynamic configurable logic blocks 902. The interconnect portions of dynamic CLBs 902 can include, for example, interconnect driver circuits implemented as shown in any of FIGS. 4-7. Dynamic CLBs 902 can also include programmable LUT circuits such as those shown and described by Chirania et al. in U.S. patent application Ser. No. Ser. No. 10/941,607, for example.

In the FPGA of FIG. 9, each dynamic programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element (INT 911) also includes the connections to and from the programmable logic element within the same tile, as shown by the examples included at the top of FIG. 9. In some embodiments, the dynamic CLBs 902 include dynamic interconnect elements such as those described above. In some embodiments, all interconnect elements in the PLD are implemented using dynamic multiplexers such as those described above. In other embodiments, only some of the interconnect elements in the PLD are implemented using dynamic logic.

A CLB 902 can include a configurable logic element (CLE 912) that can be programmed to implement user logic plus a single programmable interconnect element (INT 911). A BRAM 903 can include a BRAM logic element (BRL 913) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL 914) in addition to an appropriate number of programmable interconnect elements. An IOB 904 can include, for example, two instances of an input/output logic element (IOL 915) in addition to one instance of the programmable interconnect element (INT 911). As will be clear to those of skill in the art, the actual I/O pads connected, for example, to the I/O logic element 915 are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 909 extending from this column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic, and can be implemented using dynamic logic or static logic, bearing in mind that it may be desirable to provide a flip-flop or latch at each interface between dynamic and static logic elements. For example, the processor block PROC 910 shown in FIG. 9 spans several columns of CLBs and BRAMs.

Note that FIG. 9 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic, but the number of adjacent columns varies with the size of the FPGA.

This invention can be embodied in other forms without departing from the spirit or essential attributes thereof. Accordingly, reference should be made to the following claims, rather than to the foregoing specification, as indicating the scope of the invention.

What is claimed is:

1. An integrated circuit (IC), comprising:
   a plurality of logic circuits; and
   a plurality of self-resetting interconnect driver circuits coupled between the logic circuits, each self-resetting interconnect driver circuit comprising:
      a multiplexer circuit having a plurality of input terminals coupled to receive input signals from the logic circuits and further having an output terminal; and
      a buffer circuit having an input terminal coupled to the output terminal of the multiplexer circuit and further having an output terminal coupled to provide an output signal to one or more of the logic circuits,
   wherein in a first state the buffer circuit drives a first value onto the output terminal of the buffer circuit;
   wherein in a second state the buffer circuit first drives a second value onto the output terminal of the buffer circuit and then returns to the first state; and
   wherein the buffer circuit comprises:
      an input terminal coupled to the multiplexer output terminal;
      an output terminal;
      first and second internal nodes;
      a first pullup coupled to the input terminal of the buffer circuit and having a gate terminal coupled to the first internal node;
      a first inverter having an input terminal coupled to the input terminal of the buffer circuit and an output terminal coupled to the first internal node;
      a second pullup coupled between the first inverter and a power high, the second pullup having a gate terminal coupled to the second internal node;
      a pulldown coupled between the first internal node and a ground, the pulldown having a gate terminal coupled to the second internal node;
      a second inverter having an input terminal coupled to the first internal node and an output terminal coupled to the output terminal of the buffer circuit; and
      a reset circuit having an input terminal coupled to the output terminal of the second inverter and further having an output terminal coupled to the second internal node.

2. The IC of claim 1, wherein the IC comprises a programmable logic device (PLD), and the multiplexer circuit comprises a programmable multiplexer circuit.

3. The IC of claim 2, wherein the PLD comprises a field programmable gate array (FPGA), and the programmable multiplexer circuit is controlled by configuration memory cells of the FPGA.

4. The IC of claim 1, wherein the logic circuits comprise self-resetting logic circuits.

5. The IC of claim 1, wherein the first value is a high value and the second value is a low value.

6. The IC of claim 1, wherein the second inverter comprises a P-channel transistor coupled between the output terminal of the second inverter and the power high, the P-channel transistor having a gate terminal coupled to the first internal node.

7. The IC of claim 1, wherein the second inverter comprises an N-channel transistor coupled between the output terminal of the second inverter and the power high, the N-channel transistor having a gate terminal coupled to an output terminal of a third inverter driven by the first internal node.

8. The IC of claim 1, wherein the reset circuit comprises a third inverter.

9. An integrated circuit (IC), comprising:
   a plurality of logic circuits; and
   a plurality of self-resetting interconnect driver circuits coupled between the logic circuits, each self-resetting interconnect driver circuit comprising:
      a multiplexer circuit having a plurality of input terminals coupled to receive input signals from the logic circuits and further having an output terminal; and
      a buffer circuit having an input terminal coupled to the output terminal of the multiplexer circuit and further having an output terminal coupled to provide an output signal to one or more of the logic circuits,
   wherein in a first state the buffer circuit drives a first value onto the output terminal of the buffer circuit;
   wherein in a second state the buffer circuit first drives a second value onto the output terminal of the buffer circuit and then returns to the first state; and
   wherein the buffer circuit comprises:
      an input terminal coupled to the multiplexer output terminal;
      an output terminal;
      first and second internal nodes;
      a first pullup coupled to the input terminal of the buffer circuit and having a gate terminal coupled to the first internal node;
      a first inverter having an input terminal coupled to the input terminal of the buffer circuit and an output terminal coupled to the first internal node;
      a second pullup coupled between the first inverter and a power high, the second pullup having a gate terminal coupled to the second internal node;
      a first pulldown coupled between the first internal node and a ground, the first pulldown having a gate terminal coupled to the second internal node;
      a second pulldown coupled between the output terminal of the buffer circuit and the ground, the second pulldown having a gate terminal coupled to the first internal node; and
      a reset circuit having an input terminal coupled to the output terminal of the buffer circuit and further having an output terminal coupled to the second internal node.

10. The IC of claim 9, wherein the reset circuit comprises a second inverter.

11. An interconnect driver circuit, comprising:
   an interconnect multiplexer having a plurality of input terminals and further having a multiplexer output terminal; and a buffer circuit comprising:
  an input terminal coupled to the multiplexer output terminal;
  an output terminal;
  first and second internal nodes;
  a first pullup coupled to the input terminal of the buffer circuit and having a gate terminal coupled to the first internal node;
  a first inverter having an input terminal coupled to the input terminal of the buffer circuit and an output terminal coupled to the first internal node;
  a second pullup coupled between the first inverter and a power high, the second pullup having a gate terminal coupled to the second internal node;
  a first pulldown coupled between the first internal node and a ground, the first pulldown having a gate terminal coupled to the second internal node;
  a second pulldown coupled between the output terminal of the buffer circuit and the ground, the second pulldown having a gate terminal coupled to the first internal node; and
  a reset circuit having an input terminal coupled to the output terminal of the buffer circuit and further having an output terminal coupled to the second internal node.

12. The interconnect driver circuit of claim 11, further comprising:
  a third pullup coupled between the output terminal of the buffer circuit and the power high, the third pullup having a gate terminal coupled to the first internal node.

13. The interconnect driver circuit of claim 12, wherein the third pullup comprises a P-channel transistor.

14. The interconnect driver circuit of claim 12, wherein the third pullup comprises an N-channel transistor, and the gate terminal of the third pullup is coupled to the first internal node via an inverting logic gate.

15. The interconnect driver circuit of claim 11, wherein the reset circuit comprises a second inverter.

16. An interconnect driver circuit, comprising:
  an interconnect multiplexer having a plurality of input terminals and further having a multiplexer output terminal; and
  a buffer circuit comprising:
    an input terminal coupled to the multiplexer output terminal;
    an output terminal;
    an internal node;
    a first pullup coupled to the input terminal of the buffer circuit and having a gate terminal coupled to the internal node;
    a inverter having an input terminal coupled to the input terminal of the buffer circuit and an output terminal coupled to the internal node;
    a second pullup coupled between the output terminal of the buffer circuit and a power high, the second pullup having a gate terminal coupled to the input terminal of the buffer circuit; and
    a pulldown coupled between the output terminal of the buffer circuit and a ground, the pulldown having a gate terminal coupled to the internal node.

17. The interconnect driver circuit of claim 16, wherein the second pullup comprises an N-channel transistor.

* * * * *